United States Patent
Tsai

(10) Patent No.: US 9,171,856 B2
(45) Date of Patent: Oct. 27, 2015

(54) BIAS GENERATOR FOR FLASH MEMORY AND CONTROL METHOD THEREOF

(71) Applicant: eMemory Technology Inc., Hsin-Chu (TW)

(72) Inventor: Yu-Hsiung Tsai, Hsinchu (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 14/242,022

(22) Filed: Apr. 1, 2014

(65) Prior Publication Data

US 2015/0092497 A1    Apr. 2, 2015

Related U.S. Application Data

(60) Provisional application No. 61/885,021, filed on Oct. 1, 2013.

(51) Int. Cl.

| | |
|---|---|
| *G11C 11/34* | (2006.01) |
| *H01L 27/115* | (2006.01) |
| *H01L 29/423* | (2006.01) |
| *H01L 29/49* | (2006.01) |
| *G11C 5/14* | (2006.01) |
| *G11C 16/04* | (2006.01) |
| *G11C 16/28* | (2006.01) |
| *G11C 16/30* | (2006.01) |
| *G11C 7/12* | (2006.01) |
| *H01L 21/28* | (2006.01) |

(52) U.S. Cl.
CPC .......... *H01L 27/11558* (2013.01); *G11C 5/147* (2013.01); *G11C 7/12* (2013.01); *G11C 16/0408* (2013.01); *G11C 16/28* (2013.01); *G11C 16/30* (2013.01); *H01L 21/28273* (2013.01); *H01L 27/11519* (2013.01); *H01L 27/11521* (2013.01); *H01L 29/42328* (2013.01); *H01L 29/4916* (2013.01); *G11C 16/0433* (2013.01)

(58) Field of Classification Search
CPC ........ G11C 16/12; G11C 16/30; G11C 16/10; G11C 11/4074; G11C 16/0483
USPC ................ 365/185.18, 185.2, 185.29, 189.09
See application file for complete search history.

(56) References Cited

U.S. PATENT DOCUMENTS

| 6,205,074 | B1 | 3/2001 | Van Buskirk et al. | |
|---|---|---|---|---|
| 7,184,313 | B2 * | 2/2007 | Betser et al. ............. | 365/185.24 |
| 2011/0063917 | A1 * | 3/2011 | Shiino et al. ............. | 365/185.17 |

* cited by examiner

*Primary Examiner* — Shawki S Ismail
*Assistant Examiner* — Muhammad Islam
(74) *Attorney, Agent, or Firm* — Justin King; WPAT, P.C.

(57) ABSTRACT

A bias voltage generator for providing a control voltage and a source line voltage to a memory array includes a reference voltage generating circuit and a voltage converting circuit. The reference voltage generating circuit receives a program signal or an erase signal, and generates a reference voltage. If the program signal is received by the reference voltage generating circuit, the reference voltage has a positive temperature coefficient. If the erase signal is received by the reference voltage generating circuit, the reference voltage has a negative temperature coefficient. The voltage converting circuit converts the reference voltage into the control voltage and the source line voltage. The voltage converting circuit enlarges the reference voltage by a first magnification so as to produce the source line voltage, and enlarges the reference voltage by a second magnification so as to produce the control voltage.

23 Claims, 6 Drawing Sheets

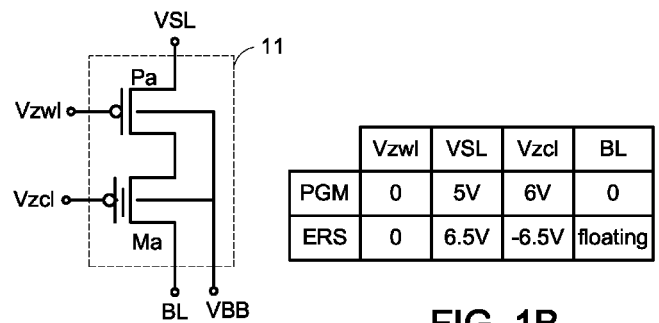
FIG. 1A
(PRIOR ART)
FIG. 1B
(PRIOR ART)
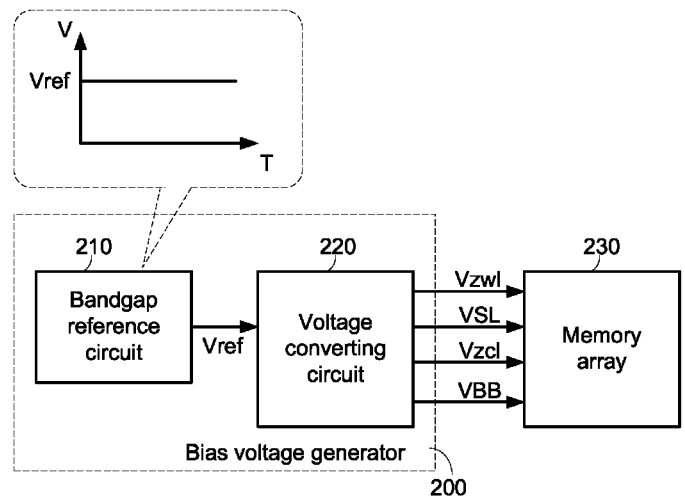
FIG. 2 (PRIOR ART)

|  | Process variation | | |
| --- | --- | --- | --- |
|  | TT | FF | SS |
| 90 °C | 4.4V | 4.6V | 4.3V |
| 25 °C | 4.6V | 4.8V | 4.5V |
| -45 °C | 4.7V | 4.8V | 4.7V |

FIG. 3A

|  | Process variation | | |
| --- | --- | --- | --- |
|  | TT | FF | SS |
| 90 °C | 1.9V | 2.2V | 2V |
| 25 °C | 2.1V | 2.3V | 2.1V |
| -45 °C | 2.4V | 2.5V | 2.4V |

BIAS GENERATOR FOR FLASH MEMORY AND CONTROL METHOD THEREOF

This application claims the benefit of U.S. provisional application Ser. No. 61/885,021, filed Oct. 1, 2013, the subject matter of which is incorporated herein by reference.

FIELD OF THE INVENTION

The present invention relates to a circuit for a flash memory and a control method thereof, and more particularly to a bias generator for a flash memory and a control method thereof.

BACKGROUND OF THE INVENTION

As is well known, a flash memory is a non-volatile memory. After the flash memory is powered off, the stored data are still retained in the flash memory. Consequently, the flash memory is widely used in a variety of electronic products.

Generally, the memory array of the flash memory comprises plural memory cells. In addition, each memory cell has a floating gate transistor.

During a program cycle, hot carriers are selectively injected into a floating gate of the floating gate transistor. For example, if no hot carriers are injected into the floating gate, the memory cell has a first storing state (e.g. the state "1"). Whereas, if the hot carriers are injected into the floating gate, the memory cell has a second storing state (e.g. the state "0").

Moreover, after the hot carriers are injected into the floating gate, a threshold voltage of the floating gate transistor is subject to a change. Consequently, during a read cycle, the storing state of the memory cell may be realized according to the threshold voltage of the floating gate transistor.

Moreover, during an erase cycle, the hot carriers are rejected from the floating gate.

FIG. 1A is a schematic circuit diagram illustrating a memory cell of a flash memory. As shown in FIG. 1A, the memory cell 11 comprises a select transistor Pa and a floating gate transistor Ma. These two transistors are both p-channel metal-oxide-semiconductor transistors. In addition, the body terminals of these two transistors are connected to a body voltage VBB (e.g. 6V).

The source terminal of the select transistor Pa is connected to a source line to receive a source line voltage VSL. The gate terminal of the select transistor Pa receives a select voltage Vzwl. The source terminal of the floating gate transistor Ma is connected to the drain terminal of the select transistor Pa. The gate terminal of the floating gate transistor Ma receives a control voltage Vzcl. The drain terminal of the floating gate transistor Ma is connected to a bit line BL.

FIG. 1B is a table illustrating associated voltages of the flash memory during a program cycle (PGM) and during an erase cycle (ERS).

During the program cycle, the select voltage Vzwl is 0V. Since the select voltage Vzwl is 0V, it means that the select transistor Pa is selected and turned on. In addition, the source line voltage VSL is 5V, the control voltage Vzcl is 6V, the bit line BL receives 0V, and the body voltage VBB is 6V. Consequently, a program current flows toward the bit line BL. When the program current flows through a channel of the floating gate transistor Ma, the hot carriers are injected into the floating gate. Meanwhile, the program action is completed.

During the erase cycle, the select voltage Vzwl is 0V. Since the select voltage Vzwl is 0V, it means that the select transistor Pa is selected and turned on. In addition, the source line voltage VSL is 6.5V, the control voltage Vzcl is −6.5V, the bit line BL is in a floating state, and the body voltage VBB is 6V. Under this circumstance, since the voltage difference between the gate terminal and the body terminal of the floating gate transistor Ma is 12.5V, the hot carriers are rejected from the floating gate to the body terminal. Meanwhile, the erase action is completed.

From the above discussions, it is necessary to provide higher positive voltages (or lower negative voltages) during the program cycle or the erase cycle of the flash memory. Generally, these voltages are generated by a bias voltage generator.

FIG. 2 is a schematic functional block diagram illustrating a conventional bias voltage generator. As shown in FIG. 2, the conventional bias voltage generator 200 comprises a bandgap reference circuit 210 and a voltage converting circuit 220.

The bandgap reference circuit 210 generates a reference voltage Vref to the voltage converting circuit 220. By the voltage converting circuit 220, the reference voltage Vref is converted into plural output voltages. The output voltages are transmitted to a memory array 230. For example, these output voltages contain the source line voltage VSL, the select voltage Vzwl, the control voltage Vzcl and the body voltage VBB.

Generally, the reference voltage Vref provided by the bandgap reference circuit 210 is stable. In other words, the reference voltage Vref does not vary with the fabricating process, the temperature and the power supply voltage. That is, even if the ambient temperature changes, the reference voltage Vref provided by the bandgap reference circuit 210 is maintained at a fixed voltage value (e.g. 1.163V).

In addition, the voltage converting circuit 220 is a charge pump for enlarging the reference voltage Vref by a specified magnification in order to produce various output voltages. For example, the voltage converting circuit 220 may enlarge the reference voltage Vref by a first magnification in order to produce the source line voltage VSL; and the voltage converting circuit 220 may enlarge the reference voltage Vref by a second magnification in order to produce the control voltage Vzcl. In this way, the bias voltage generator 200 can produce accurate output voltages.

SUMMARY OF THE INVENTION

An embodiment of the present invention provides a bias voltage generator for a flash memory. The bias voltage generator is used for generating a control voltage and a source line voltage to a memory array. The bias voltage generator includes a reference voltage generating circuit and a voltage converting circuit. The reference voltage generating circuit receives a program signal or an erase signal, and generates a reference voltage. If the program signal is received by the reference voltage generating circuit, the reference voltage has a first positive temperature coefficient. If the erase signal is received by the reference voltage generating circuit, the reference voltage has a first negative temperature coefficient. The voltage converting circuit receives the reference voltage, and converts the reference voltage into the control voltage and the source line voltage.

Another embodiment of the present invention provides a bias control method for a flash memory for generating a control voltage and a source line voltage to a memory array. The bias control method includes the following steps. During a program cycle of the memory array, a reference voltage with a first positive temperature coefficient is provided to a voltage converting circuit. Consequently, the voltage converting circuit converts the reference voltage into the control voltage and the source line voltage. During an erase cycle of the memory array, the reference voltage with a first negative temperature coefficient is provided to the voltage converting circuit. Consequently, the voltage converting circuit converts the reference voltage into the control voltage and the source line voltage.

A further embodiment of the present invention provides a flash memory. The flash memory includes a bias voltage generator, a memory array, a sense amplifier, and a bias current generator. The bias voltage generator includes a reference voltage generating circuit and a voltage converting circuit. The reference voltage generating circuit receives a program signal or an erase signal, and generates a reference voltage. If the program signal is received by the reference voltage generating circuit, the reference voltage has a first positive temperature coefficient. If the erase signal is received by the reference voltage generating circuit, the reference voltage has a first negative temperature coefficient. The voltage converting circuit receives the reference voltage, and converts the reference voltage into a control voltage and a source line voltage. The memory array receives the control voltage and the source line voltage during a program cycle or an erase cycle of the memory array. The sense amplifier is connected with the memory array. During a program verification of the memory array, the sense amplifier receives a memory cell current from the memory array. Moreover, during the program verification of the memory array, the bias current generator generates a reference current to the sense amplifier. The reference current has a second positive temperature coefficient.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1A (prior art) is a schematic circuit diagram illustrating a memory cell of a flash memory;

FIG. 1B (prior art) is a table illustrating associated voltages of the flash memory during a program cycle and during an erase cycle;

FIG. 2 (prior art) is a schematic functional block diagram illustrating a conventional bias voltage generator;

FIG. 3A is a table illustrating the threshold voltages of the memory cells with various process variations after a program action is performed at different temperatures;

FIG. 3B is a table illustrating the threshold voltages of the memory cells with various process variations after an erase action is performed at different temperatures;

DETAILED DESCRIPTION OF PREFERRED EMBODIMENTS

Figure 4:
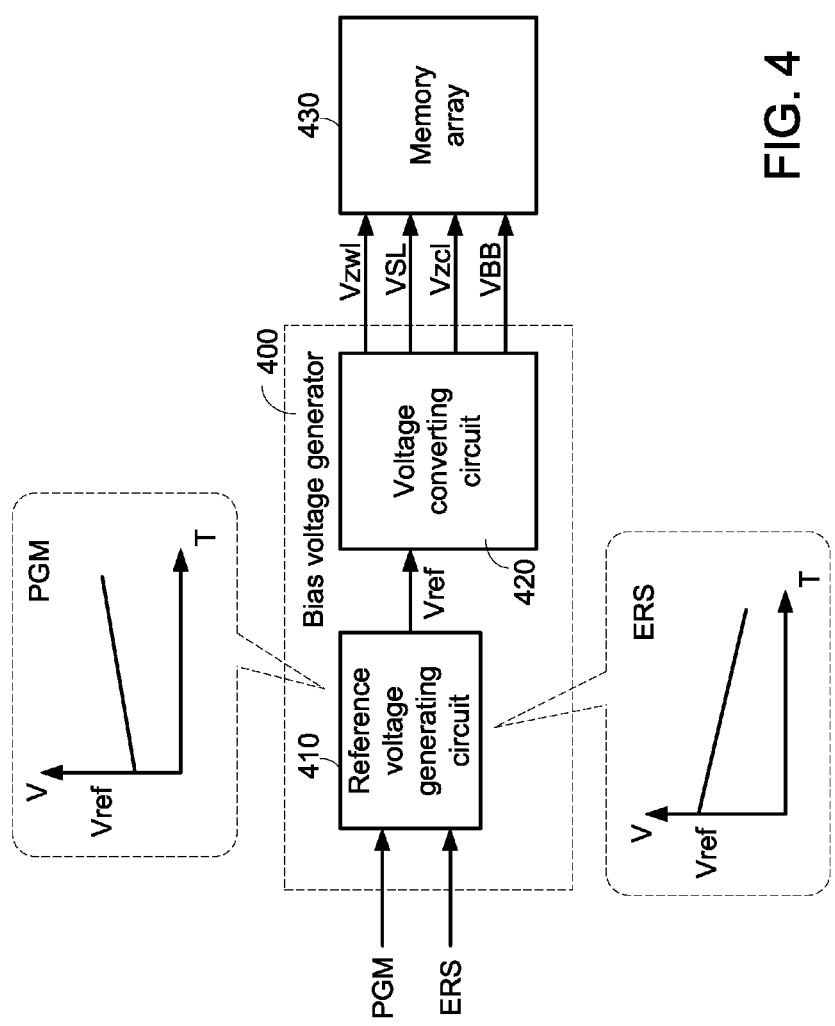
FIG. 4 is a schematic functional block diagram illustrating a bias voltage generator for a flash memory according to an embodiment of the present invention.

Due to a semiconductor process variation, the properties between difference memory cells of the memory array are somewhat different. Although the conventional bias voltage generator can produce accurate output voltages, there are still some drawbacks. For example, some memory cells with inferior properties may cause a deteriorated program result or a failed program result after the program cycle, and some memory cells with inferior properties may cause a deteriorated erase result or a failed erase result after the erase cycle.

Generally, in a semiconductor manufacturing process, the process variation may result in different switching speeds of the transistors. If the n-type transistor and the p-type transistor have faster switching speeds, the process variation is referred as a FF corner. If the n-type transistor and the p-type transistor have slower switching speeds, the process variation is referred as a SS corner. If the n-type transistor and the p-type transistor have typical switching speeds, the process variation is referred as a TT corner.

FIG. 3A is a table illustrating the threshold voltages of the memory cells with various process variations after a program action is performed at different temperatures. Generally, if the same bias voltage is provided to program the memory cells with various process variations, after the program action is performed, the threshold voltages of the floating gate transistors of the memory cells are different.

For example, the bias conditions for performing the program action at 90° C. include: the select voltage Vzwl is 0V, the source line voltage VSL is 5V, the control voltage Vzcl is 6V, the bit line BL receives 0V, and the body voltage VBB is 6V. After the program action, the threshold voltage of the floating gate transistor of the memory cell corresponding to the TT corner is about 4.4V, the threshold voltage of the floating gate transistor of the memory cell corresponding to the FF corner is about 4.6V, and the threshold voltage of the floating gate transistor of the memory cell corresponding to the SS corner is about 4.3V.

The bias conditions for performing the program action at 25° C. are identical to the above bias conditions. After the program action, the threshold voltage of the floating gate transistor of the memory cell corresponding to the TT corner is about 4.6V, the threshold voltage of the floating gate transistor of the memory cell corresponding to the FF corner is about 4.8V, and the threshold voltage of the floating gate transistor of the memory cell corresponding to the SS corner is about 4.5V.

The bias conditions for performing the program action at −45° C. are identical to the above bias conditions. After the program action, the threshold voltage of the floating gate transistor of the memory cell corresponding to the TT corner is about 4.7V, the threshold voltage of the floating gate transistor of the memory cell corresponding to the FF corner is about 4.8V, and the threshold voltage of the floating gate transistor of the memory cell corresponding to the SS corner is about 4.7V.

Generally, after the program action, the higher threshold voltage of the floating gate transistor of the memory cell is more feasible. Obviously, after the program action is performed at 90° C. in the same bias conditions, the floating gate transistor of the memory cell has lower threshold voltage.

FIG. 3B is a table illustrating the threshold voltages of the memory cells with various process variations after an erase action is performed at different temperatures. Generally, if the same bias voltage is provided to erase the memory cells with various process variations, after the erase action is performed, the threshold voltages of the floating gate transistors of the memory cells are different.

For example, the bias conditions for performing the erase action at 90° C. include: the select voltage Vzwl is 0V, the source line voltage VSL is 6.5V, the control voltage Vzcl is −6.5V, the bit line BL receives 0V, and the body voltage VBB is 6.5V. After the erase action, the threshold voltage of the floating gate transistor of the memory cell corresponding to the TT corner is about 1.9V, the threshold voltage of the floating gate transistor of the memory cell corresponding to the FF corner is about 2.2V, and the threshold voltage of the floating gate transistor of the memory cell corresponding to the SS corner is about 2V.

The bias conditions for performing the erase action at 25° C. are identical to the above bias conditions. After the erase action, the threshold voltage of the floating gate transistor of the memory cell corresponding to the TT corner is about 2.1V, the threshold voltage of the floating gate transistor of the memory cell corresponding to the FF corner is about 2.3V, and the threshold voltage of the floating gate transistor of the memory cell corresponding to the SS corner is about 2.1V.

The bias conditions for performing the erase action at −45° C. are identical to the above bias conditions. After the erase action, the threshold voltage of the floating gate transistor of the memory cell corresponding to the TT corner is about 2.4V, the threshold voltage of the floating gate transistor of the memory cell corresponding to the FF corner is about 2.5V, and the threshold voltage of the floating gate transistor of the memory cell corresponding to the SS corner is about 2.4V.

Generally, after the erase action, the lower threshold voltage of the floating gate transistor of the memory cell is more feasible. Obviously, after the erase action is performed at −45° C. in the same bias conditions, the floating gate transistor of the memory cell has higher threshold voltage.

Due to the above-mentioned properties of the memory cells, the present invention provides a bias voltage generator for a flash memory. FIG. 4 is a schematic functional block diagram illustrating a bias voltage generator for a flash memory according to an embodiment of the present invention. As shown in FIG. 4, the bias voltage generator 400 comprises a reference voltage generating circuit 410 and a voltage converting circuit 420.

The reference voltage generating circuit 410 generates a reference voltage Vref to the voltage converting circuit 420. By the voltage converting circuit 420, the reference voltage Vref is converted into plural output voltages. The output voltages are transmitted to a memory array 430. For example, these output voltages contain the source line voltage VSL, the select voltage Vzwl, the control voltage Vzcl and the body voltage VBB.

In addition, the voltage converting circuit 420 is a charge pump for enlarging the reference voltage Vref by a specified magnification in order to produce various output voltages. For example, a first pumping unit of the voltage converting circuit 420 may enlarge the reference voltage Vref by a first magnification in order to produce the source line voltage VSL; and a second pumping unit of the voltage converting circuit 420 may enlarge the reference voltage Vref by a second magnification in order to produce the control voltage Vzcl.

As previously described, the reference voltage Vref provided by the conventional bias generator is stable, and the reference voltage Vref does not vary with the fabricating process, the temperature and the power supply voltage. On the contrary, during the program cycle or the erase cycle, the reference voltage Vref provided by the reference voltage generating circuit 410 of the bias voltage generator 400 of this embodiment may vary with the temperature.

In accordance with a feature of the present invention, the reference voltage generating circuit 410 has a positive temperature coefficient during the program cycle of the flash memory. Consequently, as the temperature increases, the reference voltage Vref increases. Since the reference voltage Vref increases with the increasing temperature, the control voltage Vzcl increases with the increasing temperature.

During the program cycle, the control voltage Vzcl may be considered as a program voltage. That is, if the program action is performed at a higher temperature, more hot carriers can be injected into the floating gate according to the higher control voltage Vzcl. Consequently, the threshold voltage of the floating gate transistor can be effectively increased. In other words, the problem of causing the lower threshold voltage of the floating gate transistor by the conventional bias voltage generator after the program action is performed at a higher temperature will be overcome.

In accordance with another feature of the present invention, the reference voltage generating circuit 410 has a negative temperature coefficient during the erase cycle of the flash memory. Consequently, as the temperature increases, the reference voltage Vref decreases. Since the reference voltage Vref decreases with the increasing temperature, the control voltage Vzcl decreases with the increasing temperature.

During the erase cycle, the control voltage Vzcl may be considered as an erase voltage. That is, if the erase action is performed at a lower temperature, more hot carriers can be ejected from the floating gate according to the lower control voltage Vzcl. Consequently, the threshold voltage of the floating gate transistor can be effectively decreased. In other words, the problem of causing the higher threshold voltage of the floating gate transistor by the conventional bias generator after the erase action is performed at a lower temperature will be overcome.

Figure 5:
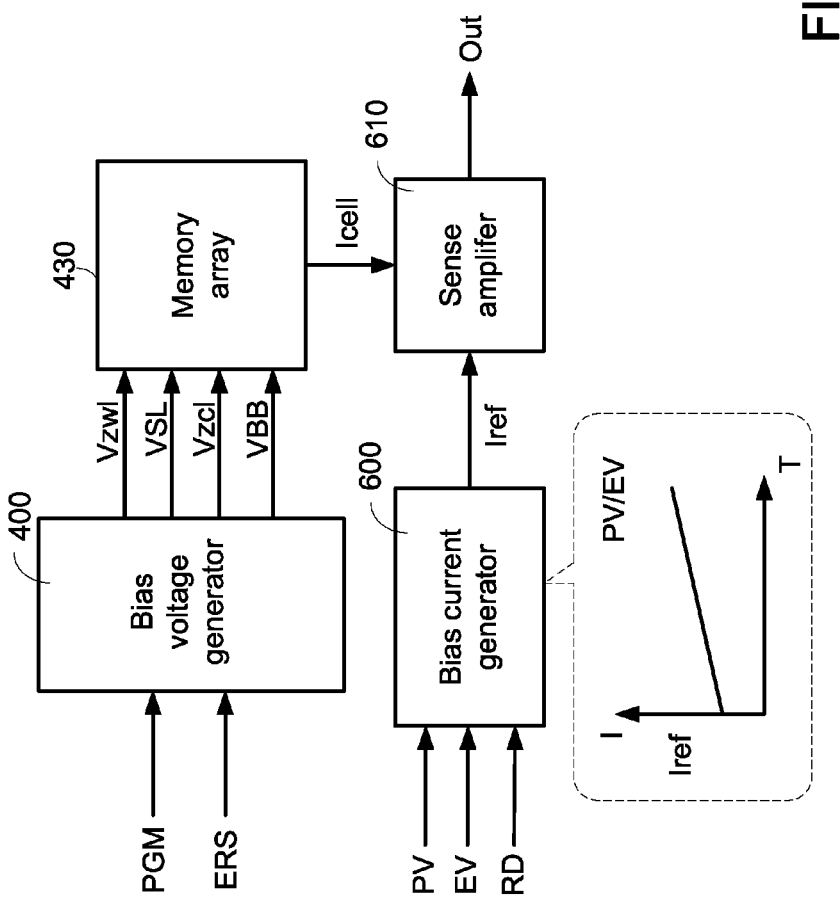
FIG. 5 is a schematic functional block diagram illustrating a bias current generator for a flash memory according to an embodiment of the present invention.

FIG. 5 is a schematic functional block diagram illustrating a bias current generator for a flash memory according to an embodiment of the present invention. As shown in FIG. 5, the bias current generator 600 generates a reference current Iref to a sense amplifier 610. By comparing a memory cell current Icell and the reference current Iref, the sense amplifier 610 outputs a memory cell state Out. Moreover, the sense amplifier 610 may be applied to the normal read operation (RD), the program verification (PV) and the erase verification (EV).

In this embodiment, after the program action is completed, the program verification (PV) will be performed; and after the erase action is completed, the erase verification (EV) will be performed. During the program verification (PV) and the erase verification (EV), the reference current Iref provided by the bias current generator 600 has a positive temperature coefficient. As the temperature increases, the reference current Iref increases. Consequently, the verification reliability is largely enhanced and the program/erase efficiency is largely improved.

Of course, the bias current generator 600 may be applied to one of the program verification (PV) and the erase verification (EV) only.

Figure 6A:
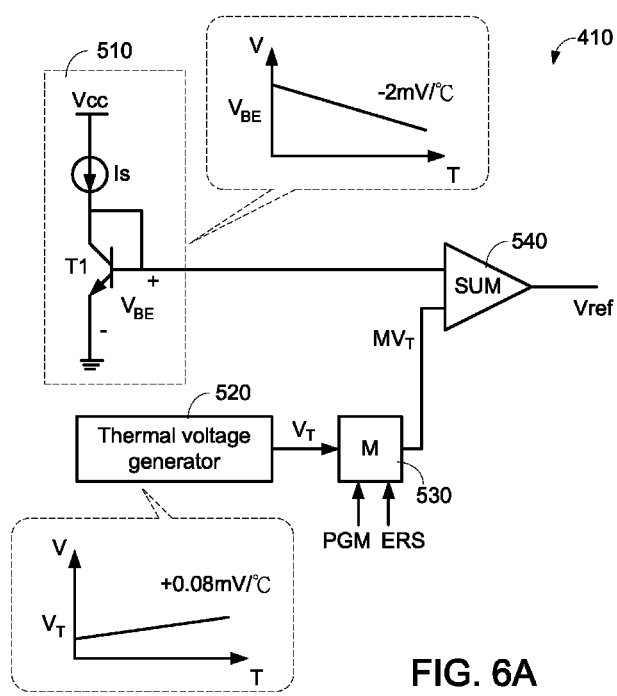
FIG. 6A is a schematic circuit diagram illustrating a reference voltage generating circuit of the bias voltage generator according to the embodiment of the present invention.

Moreover, the reference voltage generating circuit 410 as shown in FIG. 4 may be formed by modifying the bandgap reference circuit. FIG. 6A is a schematic circuit diagram illustrating a reference voltage generating circuit of the bias voltage generator according to the embodiment of the present invention. As shown in FIG. 6A, the reference voltage generating circuit 410 comprises a base-emitter voltage generator (VBE generator) 510, a thermal voltage generator 520, a gain unit 530, and a summation unit (SUM) 540. The gain unit 530 is used for providing a temperature-independent gain M.

The base-emitter voltage generator 510 comprises a constant current source (Is) and a diode-connected bipolar transistor T1. The constant current source (Is) is connected with the diode-connected bipolar transistor T1. Consequently, a base-emitter voltage $V_{BE}$ generated by the diode-connected bipolar transistor T1 has a negative temperature coefficient. In addition, the base-emitter voltage $V_{BE}$ is inputted into a first input end of the summation unit 540. For example, if the negative temperature coefficient of the base-emitter voltage $V_{BE}$ is $-2$ mV/° C., the base-emitter voltage $V_{BE}$ decreases by 2 mV with the temperature increased by 1° C.

Moreover, a thermal voltage $V_T$ generated by the thermal voltage generator 520 has a positive temperature coefficient. For example, if the positive temperature coefficient of the thermal voltage $V_T$ is $+0.08$ mV/° C., the thermal voltage $V_T$ increases by 0.08 mV with the temperature increased by 1° C.

Moreover, after the gain unit 530 multiplies the thermal voltage by the gain, the gain unit 530 generates a gain-adjusted thermal voltage (i.e. $M \times V_T$). Then, the gain-adjusted thermal voltage is inputted into a second input end of the summation unit 540. Consequently, the reference voltage Vref is outputted from the summation unit 540. That is, $Vref = V_{BE} + M \times V_T$.

As mentioned above, the negative temperature coefficient of the base-emitter voltage $V_{BE}$ is for example $-2$ mV/° C., and the positive temperature coefficient of the thermal voltage $V_T$ is for example $+0.08$ mV/° C. In case that M is smaller than 25, the reference voltage Vref outputted from the summation unit 540 has a negative temperature coefficient. For example, if M is 20, the negative temperature coefficient of the reference voltage Vref is $-0.4$ mV/° C. ($-2+20\times0.08=-0.4$). That is, while the erase action of the memory array 430 is implemented, an erase signal ERS is provided to the gain unit 530. In response to the erase signal ERS, the gain M of the gain unit 530 is controlled to be smaller than 25. Under this circumstance, the reference voltage Vref outputted from the summation unit 540 has the negative temperature coefficient. In addition, the control voltage Vzcl generated by the voltage converting circuit 420 has the negative temperature coefficient.

Whereas, in case that M is larger than 25, the reference voltage Vref outputted from the summation unit 540 has a positive temperature coefficient. For example, if M is 30, the positive temperature coefficient of the reference voltage Vref is $+0.4$ mV/° C. ($-2+30\times0.08=+0.4$). That is, while the program action of the memory array 430 is implemented, an program signal PGM is provided to the gain unit 530. In response to the program signal PGM, the gain M of the gain unit 530 is controlled to be larger than 25. Under this circumstance, the reference voltage Vref outputted from the summation unit 540 has the positive temperature coefficient. In addition, the control voltage Vzcl generated by the voltage converting circuit 420 has the positive temperature coefficient.

Whereas, in case that M is equal to 25, the gain-adjusted thermal voltage (i.e. $25 \times 0.08$) is $+2$ mV/° C., and the reference voltage Vref outputted from the summation unit 540 has a zero temperature coefficient. Under this circumstance, the reference voltage generating circuit 410 may be considered as a bandgap reference circuit.

Furthermore, other reference voltage generating circuits having the similar function maybe formed by modifying the reference voltage generating circuit 410 shown in FIG. 6A. For example, the gain unit 530 can be placed between the base-emitter voltage generator 510 and the summation unit 540 to form the equation of $Vref = M \times V_{BE} + V_T$. Or, place a first gain unit between the base-emitter voltage generator 510 and the summation unit 540, and place a second gain unit placed between the thermal voltage generator 520 and the summation unit 540. That is, $Vref = M_1 \times V_{BE} + M_2 \times V_T$.

Figure 6B:
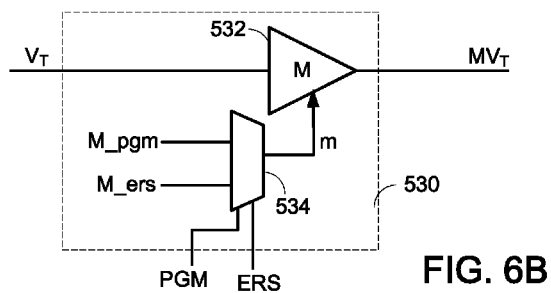
FIG. 6B is a schematic circuit diagram illustrating a gain unit of the bias voltage generator according to the embodiment of the present invention.

FIG. 6B is a schematic circuit diagram illustrating a gain unit of the bias voltage generator according to the embodiment of the present invention. As shown in FIG. 6B, the gain unit 530 comprises an amplifier 532 and a multiplexer 534. According to the program signal PGM or the erase signal ERS, the multiplexer 534 selects a program gain M_pgm or an erase gain M_ers as a gain control signal m. Moreover, according to the gain control signal m, the gain M of the amplifier 532 is correspondingly adjusted.

In this embodiment, during the program cycle of the memory array 430, the program signal PGM is provided to the multiplexer 534. Meanwhile, the program gain M_pgm is selected as the gain control signal m by the multiplexer 534. Moreover, according to the gain control signal m, the gain M of the amplifier 532 is set as the program gain M_pgm, wherein the program gain M_pgm is larger than 25. Consequently, the reference voltage Vref has the positive temperature coefficient.

Moreover, during the erase cycle of the memory array 430, the erase signal ERS is provided to the multiplexer 534. Meanwhile, the erase gain M_ers is selected as the gain control signal m by the multiplexer 534. Moreover, according to the gain control signal m, the gain M of the amplifier 532 is set as the erase gain M_ers, wherein the erase gain M_ers is smaller than 25. Consequently, the reference voltage Vref has the negative temperature coefficient.

Figure 6C:
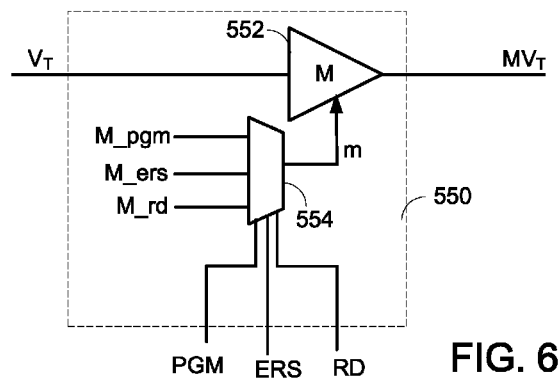
FIG. 6C is a schematic circuit diagram illustrating a gain unit of the bias voltage generator according to another embodiment of the present invention.

It is noted that numerous modifications and alterations may be made while retaining the teachings of the invention. For example, in some other embodiment as shown in FIG. 6C, the multiplexer 554 selects a read gain M_rd, a program gain M_pgm or an erase gain M_ers as the gain control signal m according to a read signal RD, the program signal PGM or the erase signal ERS. Moreover, according to the gain control signal m, the gain M of the amplifier 552 is correspondingly adjusted.

Moreover, during the read cycle of the memory array 430, the read signal RD is provided to the multiplexer 554. Meanwhile, the read gain M_rd is selected as the gain control signal m by the multiplexer 554. Moreover, according to the gain control signal m, the gain M of the amplifier 552 is set as the read gain M_rd, wherein the read gain M_rd is equal to 25. Consequently, the reference voltage Vref has the zero temperature coefficient.

Figure 7:
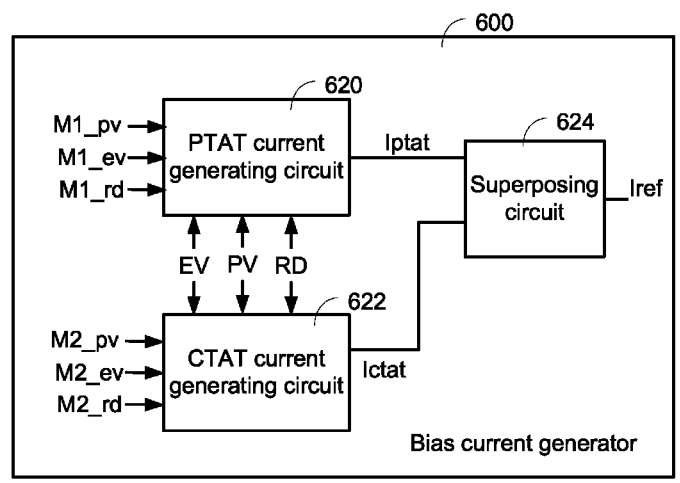
FIG. 7 is a schematic circuit diagram illustrating a bias current generator according to an embodiment of the present invention.

FIG. 7 is a schematic circuit diagram illustrating a bias current generator according to an embodiment of the present invention. As shown in FIG. 7, the bias current generator 600 comprises a proportional to absolute temperature (PTAT) current generating circuit 620, a complementary to absolute temperature (CTAT) current generating circuit 622, and a superposing circuit 624.

For example, a complementary to absolute temperature current Ictat provided by the CTAT current generating circuit 622 has a negative temperature coefficient, and a proportional to absolute temperature Iptat provided by the PTAT current generating circuit 620 has a positive temperature coefficient. After the complementary to absolute temperature current Ictat and the proportional to absolute temperature Iptat are superposed with each other by the superposing circuit 624, the reference current Iref is generated.

After the program action of the memory array 430 is completed, the program verification (PV) is performed to decide whether the programmed memory cells should be programmed again or not. During the program verification (PV), the PTAT current generating circuit 620 provides the proportional to absolute temperature Iptat according to the gain M1_pv, the CTAT current generating circuit 622 provides the complementary to absolute temperature current Ictat according to the gain M2_pv, and the Ictat and Iptat are superposed with each other by the superposing circuit 624 to generate the reference current Iref. Consequently, the temperature coefficient of the reference current Iref can be effectively controlled.

Similarly, during the erase verification (EV) or the normal read operation (RD), the reference current Iref is generated by the above approach. In other words, by inputting appropriate gains, the bias current generator of the present invention is capable of generating the reference current Iref with a desired temperature coefficient.

From the above descriptions, the present invention provides a bias generator for a flash memory and a control method thereof. During a program cycle of a memory array, a reference voltage with a positive temperature coefficient is provided. According to the reference voltage with the positive temperature coefficient, the voltage converting circuit generates a control voltage and a source line voltage with the positive temperature coefficient. Consequently, the hot carriers to be injected into a floating gate of a floating gate transistor of a memory cell are correspondingly controlled. During an erase cycle of the memory array, a reference voltage with a negative temperature coefficient is provided. According to the reference voltage with the negative temperature coefficient, the voltage converting circuit generates a control voltage and a source line voltage with the negative temperature coefficient. Consequently, the hot carriers to be ejected from the floating gate of the floating gate transistor of the memory cell are correspondingly controlled.

Moreover, the present invention provides another bias generator for a flash memory and a control method thereof. During the program verification (PV) or the erase verification (EV), the reference current provided by the bias generator has a positive temperature coefficient. As the temperature increases, the reference current increases. Consequently, the verification reliability is largely enhanced and the program/erase efficiency is largely improved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A bias voltage generator for a flash memory, the bias voltage generator generating a control voltage and a source line voltage to a memory array, the bias voltage generator comprising:
a reference voltage generating circuit receiving a program signal or an erase signal, and generating a reference voltage, wherein if the program signal is received by the reference voltage generating circuit, the reference voltage has a first positive temperature coefficient, wherein if the erase signal is received by the reference voltage generating circuit, the reference voltage has a first negative temperature coefficient; and
a voltage converting circuit receiving the reference voltage, and converting the reference voltage into the control voltage and the source line voltage;
wherein the reference voltage generating circuit comprises: a base-emitter voltage generator for generating a base-emitter voltage with a second negative temperature coefficient; a thermal voltage generator for generating a thermal voltage with a second positive temperature coefficient; a gain unit for multiplying the thermal voltage by a first gain, thereby generating a gain-adjusted thermal voltage with a third positive temperature coefficient; and a summation unit for obtaining a sum of the base-emitter voltage and the gain-adjusted thermal voltage, thereby generating the reference voltage; and
wherein the first gain is determined by the gain unit according to the program signal or the erase signal.

2. The bias voltage generator as claimed in claim 1, wherein if the program signal is received by the gain unit, a sum of the third positive temperature coefficient and the second negative temperature coefficient is equal to the first positive temperature coefficient.

3. The bias voltage generator as claimed in claim 1, wherein if the erase signal is received by the gain unit, a sum of the third positive temperature coefficient and the second negative temperature coefficient is equal to the first negative temperature coefficient.

4. The bias voltage generator as claimed in claim 1, wherein the gain unit comprises:
a multiplexer, wherein if the program signal is received by the multiplexer, the multiplexer selects a program gain as a gain control signal, wherein if the erase signal is received by the multiplexer, the multiplexer selects an erase gain as the gain control signal; and
an amplifier for controlling the first gain according to the gain control signal, and multiplying the thermal voltage by the first gain so as to generate the gain-adjusted thermal voltage.

5. The bias voltage generator as claimed in claim 1, wherein the voltage converting circuit comprises:
a first pumping unit for enlarging the reference voltage by a first magnification so as to produce the source line voltage; and
a second pumping unit for enlarging the reference voltage by a second magnification so as to produce the control voltage.

6. The bias voltage generator as claimed in claim 1, wherein the memory array comprises a memory cell, and the memory cell comprises:
a select transistor having a first source terminal receiving the source line voltage, a first gate terminal receiving a select voltage, a first drain terminal, and a first body terminal receiving a body voltage; and
a floating gate transistor having a second source terminal connected to the first drain terminal, a second gate terminal receiving the control voltage, a second drain terminal connected to a bit line, and a second body terminal receiving the body voltage.

7. The bias voltage generator as claimed in claim 4, wherein if the program signal is received by the multiplexer, the first gain is equal to the program gain, wherein if the erase signal is received by the multiplexer, the first gain is equal to the erase gain.

8. The bias voltage generator as claimed in claim 4, wherein if a read signal is received by the multiplexer, the multiplexer selects a read gain as the gain control signal, so that the first gain of the amplifier is equal to the read gain, wherein a sum of the third positive temperature coefficient and the second negative temperature coefficient is equal to a zero positive temperature coefficient.

9. A bias control method for a flash memory, the bias control method generating a control voltage and a source line voltage to a memory array, the bias control method comprising steps of:
   (a) during a program cycle of the memory array, providing a reference voltage with a first positive temperature coefficient to a voltage converting circuit, so that the voltage converting circuit converts the reference voltage into the control voltage and the source line voltage; and
   (b) during an erase cycle of the memory array, providing the reference voltage with a first negative temperature coefficient to the voltage converting circuit, so that the voltage converting circuit converts the reference voltage into the control voltage and the source line voltage;
   wherein the step (a) comprises sub-steps of: generating a base-emitter voltage with a second negative temperature coefficient; generating a thermal voltage with a second positive temperature coefficient; multiplying the thermal voltage by a first gain, thereby generating a gain-adjusted thermal voltage with a third positive temperature coefficient; and obtaining a sum of the base-emitter voltage and the gain-adjusted thermal voltage, thereby generating the reference voltage; and
   wherein a sum of the third positive temperature coefficient and the second negative temperature coefficient is equal to the first positive temperature coefficient.

10. The bias control method as claimed in claim 9, wherein the voltage converting circuit comprises a first pumping unit and a second pumping unit, wherein the first pumping unit enlarges the reference voltage by a first magnification so as to produce the source line voltage, wherein the second pumping unit enlarges the reference voltage by a second magnification so as to produce the control voltage.

11. The bias control method as claimed in claim 9, wherein the step (b) comprises sub-steps of:
   generating a base-emitter voltage with a second negative temperature coefficient;
   generating a thermal voltage with a second positive temperature coefficient;
   multiplying the thermal voltage by a first gain, thereby generating a gain-adjusted thermal voltage with a third positive temperature coefficient; and
   obtaining a sum of the base-emitter voltage and the gain-adjusted thermal voltage, thereby generating the reference voltage,
   wherein a sum of the third positive temperature coefficient and the second negative temperature coefficient is equal to the first negative temperature coefficient.

12. The bias control method as claimed in claim 9, further comprising a step (c) of providing a reference voltage with a zero temperature coefficient to the voltage converting circuit during a read cycle of the memory array, so that the voltage converting circuit converts the reference voltage into the control voltage and the source line voltage.

13. The bias control method as claimed in claim 9, wherein the memory array comprises a memory cell, and the memory cell comprises:
   a select transistor having a first source terminal receiving the source line voltage, a first gate terminal receiving a select voltage, a first drain terminal, and a first body terminal receiving a body voltage; and
   a floating gate transistor having a second source terminal connected to the first drain terminal, a second gate terminal receiving the control voltage, a second drain terminal connected to a bit line, and a second body terminal receiving the body voltage.

14. The bias control method as claimed in claim 9, further comprising a step (c) of providing a reference current with a fourth positive temperature coefficient during a program verification of the memory array, so that a sense amplifier generates an output signal according to a memory cell current from the memory array and the reference current.

15. The bias control method as claimed in claim 12, wherein the step (c) comprises sub-steps of:
   generating a base-emitter voltage with a second negative temperature coefficient;
   generating a thermal voltage with a second positive temperature coefficient;
   multiplying the thermal voltage by a first gain, thereby generating a gain-adjusted thermal voltage with a third positive temperature coefficient; and
   obtaining a sum of the base-emitter voltage and the gain-adjusted thermal voltage, thereby generating the reference voltage,
   wherein a sum of the third positive temperature coefficient and the second negative temperature coefficient is equal to the zero negative temperature coefficient.

16. The bias control method as claimed in claim 14, wherein after a complementary to absolute temperature current and a proportional to absolute temperature are superposed with each other, the reference current is generated.

17. A flash memory, comprising:
   a bias voltage generator comprising a reference voltage generating circuit and a voltage converting circuit, wherein the reference voltage generating circuit receives a program signal or an erase signal, and generates a reference voltage, wherein if the program signal is received by the reference voltage generating circuit, the reference voltage has a first positive temperature coefficient, wherein if the erase signal is received by the reference voltage generating circuit, the reference voltage has a first negative temperature coefficient, wherein the voltage converting circuit receives the reference voltage, and converts the reference voltage into a control voltage and a source line voltage;
   a memory array receiving the control voltage and the source line voltage during a program cycle or an erase cycle of the memory array;
   a sense amplifier connected with the memory array, wherein during a verification of the memory array, the sense amplifier receives a memory cell current from the memory array; and
   a bias current generator, wherein during the verification of the memory array, the bias current generator generates a reference current to the sense amplifier, wherein the reference current has a second positive temperature coefficient;
   wherein the reference voltage generating circuit comprises: a base-emitter voltage generator for generating a base-emitter voltage with a second negative temperature coefficient; a thermal voltage generator for generating a thermal voltage with a third positive temperature coefficient; a gain unit for multiplying the thermal voltage by a first gain, thereby generating a gain-adjusted thermal voltage with a fourth positive temperature coefficient; and a summation unit for obtaining a sum of the base-emitter voltage and the gain-adjusted thermal voltage, thereby generating the reference voltage; and wherein the first gain is determined by the gain unit according to the program signal or the erase signal.

18. The flash memory as claimed in claim 17, wherein if the program signal is received by the gain unit, a sum of the fourth positive temperature coefficient and the second negative temperature coefficient is equal to the first positive temperature coefficient.

19. The flash memory as claimed in claim 17, wherein if the erase signal is received by the gain unit, a sum of the fourth positive temperature coefficient and the second negative temperature coefficient is equal to the first negative temperature coefficient.

20. The flash memory as claimed in claim 17, wherein the voltage converting circuit comprises:
   a first pumping unit for enlarging the reference voltage by a first magnification so as to produce the source line voltage; and
   a second pumping unit for enlarging the reference voltage by a second magnification so as to produce the control voltage.

21. The flash memory as claimed in claim 17, wherein the memory array comprises a memory cell, and the memory cell comprises:
   a select transistor having a first source terminal receiving the source line voltage, a first gate terminal receiving a select voltage, a first drain terminal, and a first body terminal receiving a body voltage; and
   a floating gate transistor having a second source terminal connected to the first drain terminal, a second gate terminal receiving the control voltage, a second drain terminal connected to a bit line, and a second body terminal receiving the body voltage.

22. The flash memory as claimed in claim 17, wherein the bias current generator comprises:
   a proportional to absolute temperature current generating circuit, wherein during the verification of the memory array, the proportional to absolute temperature current generating circuit generates a proportional to absolute temperature current according to a first gain;
   a complementary to absolute temperature current generating circuit, wherein during the verification of the memory array, the complementary to absolute temperature current generating circuit generates a complementary to absolute temperature current according to a second gain; and
   a superposing circuit for superposing the proportional to absolute temperature current with the complementary to absolute temperature current, thereby generating the reference current, wherein the reference current has the second positive temperature coefficient.

23. The flash memory as claimed in claim 17, wherein the verification of the memory array includes a program verification after a program action of the memory array and a erase verification after an erase action of the memory array.

* * * * *